(12) United States Patent
Hench

(10) Patent No.: US 8,108,328 B2
(45) Date of Patent: Jan. 31, 2012

(54) NEURAL NETWORK BASED HERMITE INTERPOLATOR FOR SCATTEROMETRY PARAMETER ESTIMATION

(75) Inventor: John J. Hench, San Jose, CA (US)

(73) Assignees: Tokyo Electron Limited, Tokyo (JP); KLA-Tencor Corporation, Milpitas, CA (US)

( * ) Notice: Subject to any disclaimer, the term of this patent is extended or adjusted under 35 U.S.C. 154(b) by 773 days.

(21) Appl. No.: 12/175,271

(22) Filed: Jul. 17, 2008

(65) Prior Publication Data

US 2010/0017351 A1    Jan. 21, 2010

(51) Int. Cl.
*G06E 1/00* (2006.01)
(52) U.S. Cl. .......................................... 706/16
(58) Field of Classification Search ...................... 706/16
See application file for complete search history.

(56) References Cited

U.S. PATENT DOCUMENTS

| | | | |
|---|---|---|---|
| 5,867,276 A | 2/1999 | McNeil et al. | |
| 6,898,537 B1 | 5/2005 | McGahan | |
| 7,115,858 B1 * | 10/2006 | Holden et al. | 250/225 |
| 7,372,565 B1 * | 5/2008 | Holden et al. | 356/327 |

OTHER PUBLICATIONS

Jorg Bischoff, Joachim Bauer, Ulrich Haak, Lutz Hutschenreuther, and Horst Truckenbrodt "Optical scatterometry of quarter micron patterns using neural regression" Jun. 8, 1998, SPIE vol. 3332 pp. 526-537.*

Ilkka Kallioniemi, Jyrki Saarinen, and Erkki Oja Optical scatterometry of subwavelength diffraction gratings: neural-network approach Sep. 1, 1998, Applied Optics / vol. 37, No. 25.*

Allgair, John, et al., "Spectroscopic CD Offers Higher Precision Metrology for sub-0.18um Linewidth Control", *Yield Management Solutions*, (Summer 2002), 8-13.

Ferrari, Silvia, et al., "Smooth Function Approximation Using Neural Networks", *IEEE Transactions on Neural Networks*, vol. 16, No. 1, (Jan. 2005), 24-38.

* cited by examiner

*Primary Examiner* — Jeffrey A Gaffin
*Assistant Examiner* — Ababacar Seck
(74) *Attorney, Agent, or Firm* — Blakely, Sokoloff, Taylor & Zafman

(57) ABSTRACT

Generation of a meta-model for scatterometry analysis of a sample diffracting structure having unknown parameters. A training set comprising both a spectral signal evaluation and a derivative of the signal with respect to at least one parameter across a parameter space is rigorously computed. A neural network is trained with the training set to provide reference spectral information for a comparison to sample spectral information recorded from the sample diffracting structure. A neural network may be trained with derivative information using an algebraic method wherein a network bias vector is centered over both a primary sampling matrix and an auxiliary sampling matrix. The result of the algebraic method may be used for initializing neural network coefficients for training by optimization of the neural network weights, minimizing a difference between the actual signal and the modeled signal based on a objective function containing both function evaluations and derivatives.

24 Claims, 12 Drawing Sheets

NEURAL NETWORK BASED HERMITE INTERPOLATOR FOR SCATTEROMETRY PARAMETER ESTIMATION

TECHNICAL FIELD

Embodiments of the invention pertain to methods and systems for artificial neural network based interpolation and more particularly as applied to scatterometry.

BACKGROUND

Optical metrology techniques generally referred to as scatterometry offer the potential to characterize parameters of a workpiece during a manufacturing process. In practice, light is directed onto a periodic grating formed in a workpiece and a spectrum of reflected light is measured and analyzed to characterize the grating parameters. Characterization parameters may include critical dimensions (CD), sidewall angle (SWA), feature height (HT) and any which vary a material's reflectivity and refractive index. Characterization of the grating may thereby characterize the workpiece as well as manufacturing process employed in the formation of the grating and the workpiece.

Analysis of a measured spectrum typically involves comparing the measurement data to theoretical spectra in a library to deduce the parameters that best describe the measured grating. A theoretical spectrum for a set of grating parameter values can be computed using rigorous diffraction modeling algorithms, such as Rigorous Coupled Wave Analysis (RCWA). However, computing the reflection coefficient of scattered light, as a function of wavelength, from a periodic grating of a given parameterized geometry can be very slow when solving the inverse grating diffraction problem, whereby analysis of the diffracted light measurements via regression returns the estimated parameter as a function of the measured spectra. Thus, a method of estimating grating parameters more rapidly and with sufficient accuracy is needed.

Generally, a neural network may function as multidimensional Lagrange interpolator. Given a set of vector valued inputs, a corresponding set of values of a function to be interpolated, a suitable neural network topology and sufficient training of the network, the output of the neural network can be approximately equal to an original function evaluation. FIG. 1 depicts the topology of a conventional simple neural network (SNN) that is referred to as a one hidden layer network (one input p, one hidden layer, one output layer). Neural network 100 has an input vector, p, layer weight matrices, $W_i$, layer bias vectors, $d_i$, nonlinear basis function, $s(u)=[\sigma(u)_1\ \sigma(u)_2\ \ldots\ \sigma(u)_2]^T$, and output weight vector, v to provide output vector y.

BRIEF DESCRIPTION OF THE DRAWINGS

The present invention is illustrated by way of example, and not by way of limitation, in the figures of the accompanying drawings and in which.

SUMMARY

Methods, computer program products and systems to generate a meta-model of a spectral function for scatterometry analysis of a sample diffracting structure having unknown parameters are described.

In an embodiment, a training set comprising both a spectral signal evaluation and a derivative of the signal with respect to at least one parameter across a parameter space is rigorously computed. A neural network is trained as a meta-model with the training set to provide reference spectral information for a comparison to sample spectral information recorded from the sample diffracting structure.

In a further embodiment, a neural network is trained with derivative information using an algebraic method. In one such embodiment, a network bias vector is centered over both a primary sampling matrix and an auxiliary sampling matrix to facilitate incorporation of the signal derivatives.

In another embodiment, a neural network is trained with the derivative information using an optimization procedure. In one embodiment, the optimization includes minimizing a least square difference between the rigorously computed signal and the meta-modeled signal based on a objective (cost) function containing both function evaluations and derivatives.

In another embodiment, the result of an algebraic training method is employed for initializing coefficients of a neural network trained with an optimization procedure.

DETAILED DESCRIPTION

In the following description, numerous details are set forth. It will be apparent, however, to one skilled in the art, that the present invention may be practiced without these specific details. For example, while the present methods are described in the context of scatterometry for diffraction grating parameter measurements, it should be appreciated that the methods may be readily adaptable to other contexts and applications by one of ordinary skill in the art.

In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Figure 1:
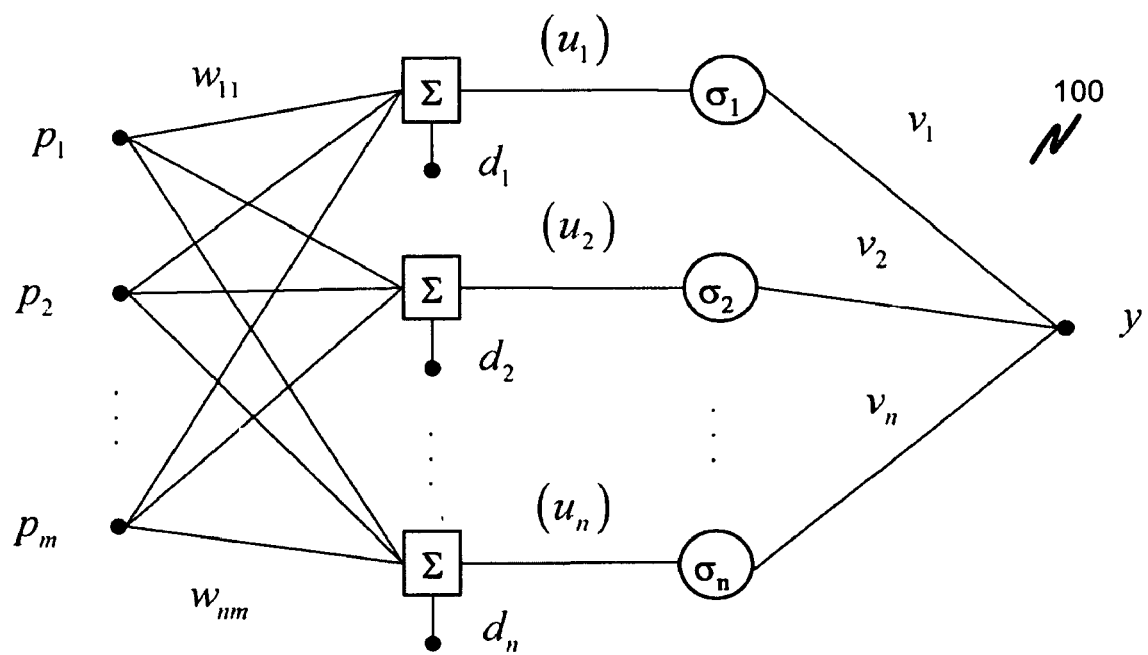
FIG. 1 illustrates a conventional one hidden layer neural network topology.
Figure 2A:
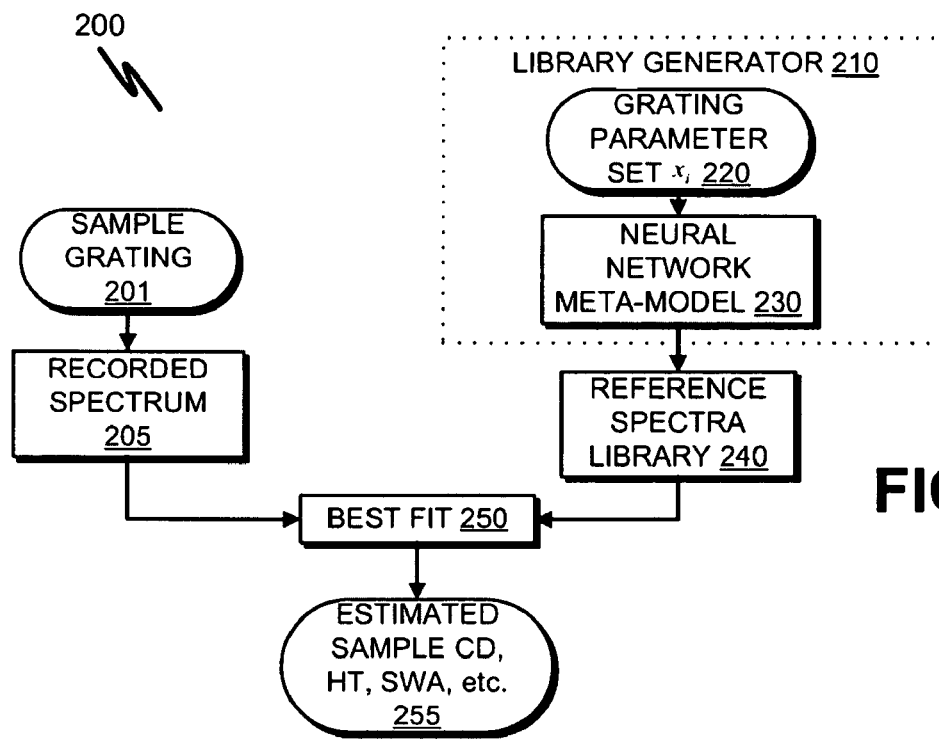
FIG. 2A illustrates an exemplary scatterometry system employing reference spectra generated with a neural network meta-model, in accordance with an embodiment.

FIG. 2A depicts an optical metrology system 200 capable of performing scatterometry. During a sample measurement, spectral information, such as the recorded spectrum 205, is acquired from a diffracting structure having unknown parameter values, such as sample grating 201. The recorded spectrum 205 is then compared by a metrology processor to a reference spectra and a minimization procedure is employed to arrive at a best fit 250 between the recorded spectrum 205 and a referenced spectral information accessed from the reference spectra library 240. The parameters associated with the reference spectrum providing the best fit 250 are provided as the estimate of the unknown parameters 255.

Optical metrology system 200 further employs a neural network meta-model 230 to produce an estimated spectrum or spectral information associated with a given set of grating parameter values 220. Each set of grating parameter values 220 includes a value for each parameter and as a set defines a point in the parameter space. The parameter space may encompass parameter values of all samples that will be measured. A parameter $p_i$ may be in the geometric domain (e.g., grating critical dimension (CD), sidewall angle (SWA), grating height (HT), surface roughness, etc.), optical domain (e.g., angle of incidence, azimuth angle, extinction coefficient, index of refraction, etc.), or manufacturing process domain (e.g., deposition tool flow rate, etc.).

In one embodiment, the neural network meta-model 230 forms a component of the library generator 210 for computing and populating a reference spectra library 240 with spectra estimates. Library generator 210 may receive numerous sets of grating parameter values 220 (e.g., based on instructions provided by a user of optical metrology system 200), defining a parameter space of one or more dimensions. The library generator 210 may be operated either in real-time (e.g., as the recorded spectrum 205 is acquired) or as a pre-processor to pre-compute reference spectra estimates.

Figure 2B:
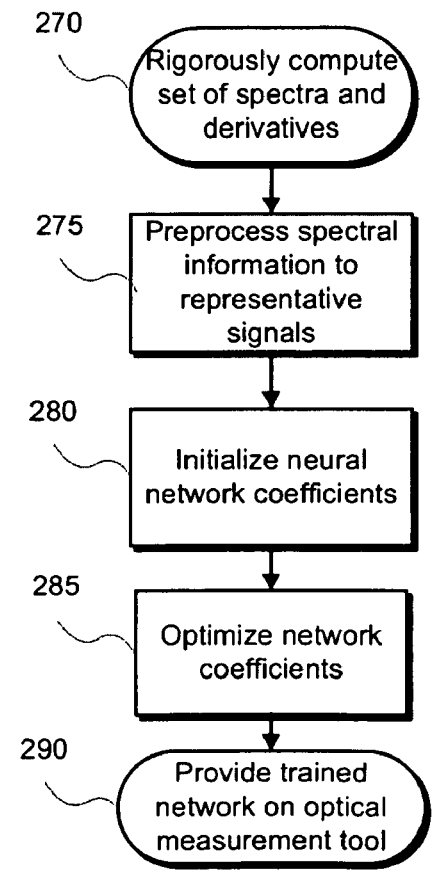
FIG. 2B is an exemplary flow diagram of training a neural network as a Hermitian interpolator for use as a neural network meta-model of diffraction spectra, in accordance with an embodiment.

To provide an estimate of a spectrum for the set of grating parameter values 220, the neural network meta-model 230 is first trained. An exemplary training method 260 is depicted in FIG. 2B. At operation 270, evaluations of the reflection coefficient $z_i = f(p_i)$ as a function of wavelength are rigorously computed. Many such function evaluations may be pre-computed using a Maxwell solver (e.g. RCWA, CM) and used to train the neural network meta-model 230 as a function interpolator. Thus, with a training set $\{p_i, z_i\}$, the Maxwell field solver may provide the reflection coefficient $y_i$ as a function of wavelength (i.e. $\alpha(\lambda)$). To reduce the size of the training data set, at operation 275, the spectral information provided via the rigorous solution may be preprocessed into representative signals. For example, in one embodiment a conventional encoding algorithm is applied at operation 275. Next, at operation 280 the neural network coefficients are initialized and training of the network at operation 285 establishes the weights of the network elements.

Once trained, the neural network meta-model 230 provides an estimate of the function $z = f(p)$ as $y = NN(p)$ for the set of grating parameter values 220 to generate reference spectra library 240. In one exemplary embodiment, at operation 290, the trained neural network is loaded onto the optical metrology system 200 for use as neural network meta-model 230. The library generator 210 may then receive an input of the set of grating parameter values 220 for which a user of the optical metrology system expects to encounter for a given manufacturing operation. This allows the optical metrology system 200 to rapidly generate user-customized spectra references for use on a particular scatterometry system.

In one embodiment, a neural network to provide a meta-model, such as the neural network meta-model 230, is trained with both the function evaluations and derivative values, in essence using the neural network as a Hermite interpolator rather than a Langrage interpolator. With a Maxwell solver (e.g., as employed in operation 270), it is frequently possible to compute not only the reflection coefficient, but also the derivatives of that coefficient with respect to the parameters that describe the grating shape. Indeed, some recent methods enable the derivatives to be computed in a small fraction of the time as the function evaluation making derivatives available for a training set comprising $$\left\{ p_i, z_i, \frac{dz_i}{dp_i} \right\}.$$

By incorporating the derivative information into the training of the neural-network, the meta-model may then be more general, better able to approximate signals representing more wavelengths, have smaller function estimation errors and generate library spectra significantly faster than training with function evaluations only.

Training of a neural network generally consists of refining the set of weights of the network links so that any given input to the model produces a correct output response. In one embodiment, a neural network is trained with an algebraic method utilizing both function evaluations and derivative values in the training step. In a specific embodiment, the algebraic method consists of configuring a single hidden-layer network and training the network by optimizing over only the output weights, v. An algebraic method is particularly attractive because, in contrast to a back propagation method, the training may be done in only one step by solving a (typically over-determined) linear system of equations. So, relative to optimization methods, computational complexity is reduced along with training time.

Figure 3A:
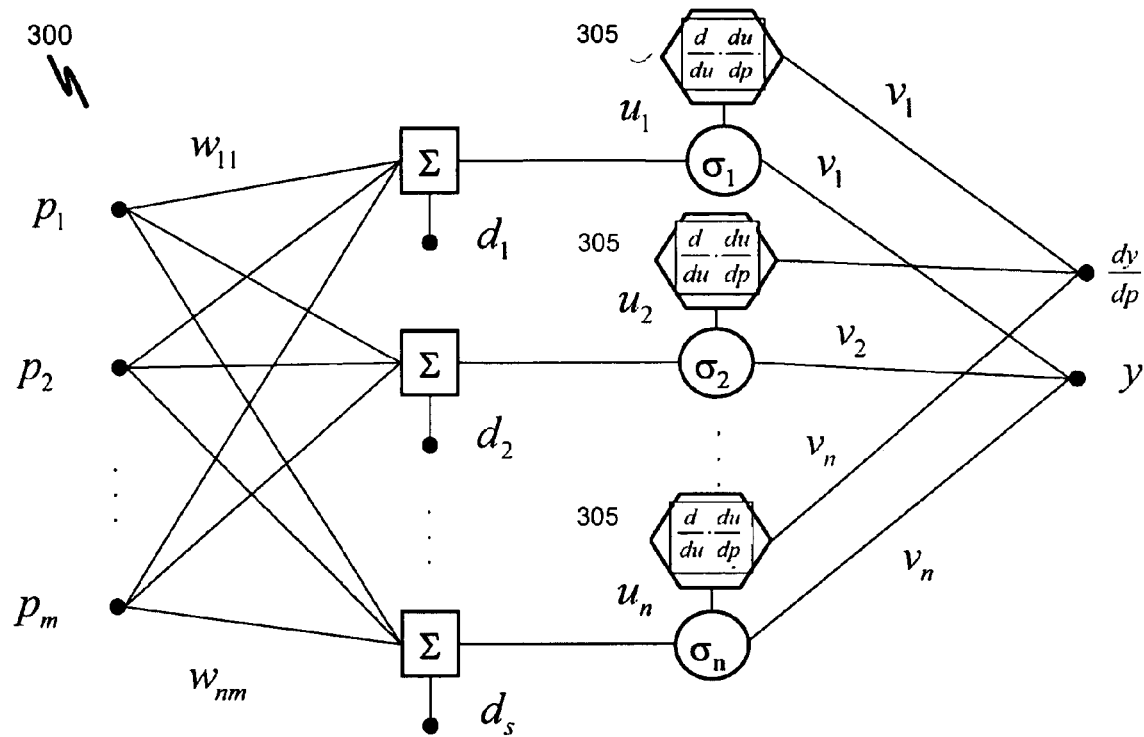
FIG. 3A illustrates an exemplary one hidden layer neural network topology incorporating derivative training information, in accordance with an embodiment.

FIG. 3A depicts a one hidden layer network 300 including function evaluation and function derivative training information according to one exemplary embodiment. The one hidden layer network 300 includes n summers and nonlinear elements. In an embodiment, the function used for the nonlinear element, $\sigma$, is the sigmoid function:

$$\sigma(u) = \frac{e^{2u} - 1}{e^{2u} + 1} \quad (1)$$

and the approximation may be written as $y=v^T s(Wp+d)$. As such, algebraic training relies on knowing all inputs to the sigmoid functions so that the weight equations then become algebraic and linear. As further depicted, the network also includes n nodal derivatives, $$\frac{d}{du} \cdot \frac{du}{dp}.$$

The approximation of the derivative may be written as $$\frac{dy}{dp} = v^T \Delta(Wp+d) = v^T \frac{ds}{du}(Wp+d)W.$$

For embodiments where a sigmoid function is employed as the nonlinear element, the sigmoid function derivative is:

$$\frac{ds}{du} = \text{diag}\left(\frac{2e^{u_i}}{(e^{u_i}+1)^2}\right) \quad (2)$$

In certain embodiments, training of the exemplary one hidden layer network 300 is by a method utilizing an auxiliary set of parameter values to compute the bias at the summers. In this manner, a diagonal function approach to setting values of the biases may be utilized even though derivatives are added such that more signals are provided with a same number of parameter samples. With this approach, nonlinear elements and summers can be added in proportion to the additional signals to maintain a level of performance and regularization of the output. This advantageous feature is depicted in the topology of the one hidden layer network 300 in FIG. 3A displaying the additional hidden nodes 305 and further described elsewhere herein for the operations of algebraic method 400.

Figure 4:
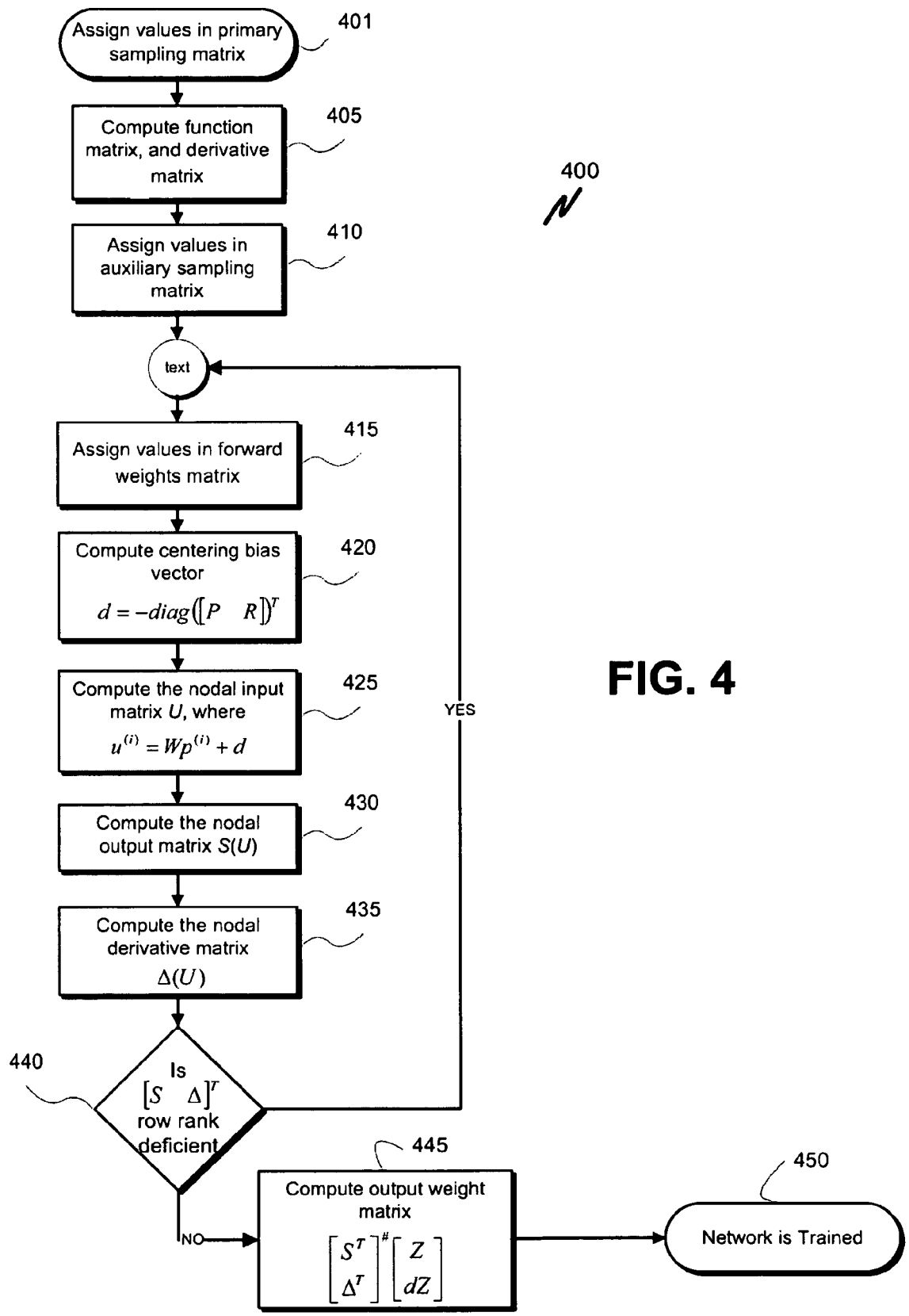
FIG. 4 is an exemplary flow diagram of a method to incorporate derivative information in algebraic training of a neural network, in accordance with an embodiment.

FIG. 4 depicts algebraic method 400 as one exemplary embodiment of training a neural network with an algebraic method utilizing both function evaluations and derivative values in the training step. Algebraic method 400 begins at operation 401 with assigning values in a primary sampling matrix by computing a primary sampling $\{p^i\}$ of M points in parameter space and storing these values in the matrix $P = [p^1 \ldots p^M]^T$. The sampling of M points may be with a suitable pseudo-random sequence.

Next, at operation 405, a function matrix and a derivative matrix are computed for the primary sampling to generate a training set. The training set may consist of M input-output samples with the inputs selected from a distribution over the desired ranges of approximation of the parameter, p. In a further embodiment, the parameter ranges conform to the set $P^m \subset R^m \ni \|p\|_\infty \leq 1 \ \forall p \in P^m$. Other parameter ranges can be mapped to the set $P^m$ by an affine scaling of each parameter. At operation 405, a partial differential equation solver may be used to evaluate the functions $\{z^i\}$ and their derivatives $$\left\{\frac{\partial z^i}{\partial p}\right\}$$

at the primary sampling points so that $z^i = f(p^i)$. In an exemplary implementation, a Maxwell solver is employed to evaluate spectral signals and their derivatives from a model of a parameterized diffracting structure, such as a diffraction grating. These values are then stored in the matrices $Z = [z(p^1) \ldots z(p^M)]^T$, and $$dZ = \left[\frac{\partial z(p^1)}{\partial p_1} \ldots \frac{\partial z(p^1)}{\partial p_N} \frac{\partial z(p^2)}{\partial p_1} \ldots \frac{\partial z(p^2)}{\partial p_N} \cdots \frac{\partial z(p^M)}{\partial p_1} \ldots \frac{\partial z(p^M)}{\partial p_N}\right]^T,$$

where N is the dimension of the parameter space. Thus, a training set including both function evaluations and function derivatives is provided by operations 401 and 405.

At operation 410, an auxiliary sampling matrix is generated. Generally, the auxiliary sampling matrix comprises additional points in parameter space not used for evaluating the function or derivative. Unlike for the primary sampling matrix P, no function evaluation is performed for the parameters in the auxiliary sampling matrix. The auxiliary sampling $\{r_i\}$ is of an additional L points in parameter space. The L points may be picked from the same distribution as P. In one embodiment, L points includes no more than M times N points (i.e. $L \leq MN$). Completing operation 410, the auxiliary sampling point values are stored in the matrix R.

At operation 415, values are assigned to the forward weights matrix, W. Values of the L+M forward weights matrix W may be selected using a suitable pseudo-random sequence. Thus, the matrix W is larger than the input matrix P. For example, the values of the forward weights matrix, W may be assigned such that $w_{ij} = v_{ij} \ni v \in (0,\zeta)$ where $w_{ij}$ represents the interconnection weight between the jth input and the ith node of a neural network, such as the one hidden layer network 300, and $\zeta$ is a tuning parameter assigning the variance of the normal distribution.

Figure 3B:
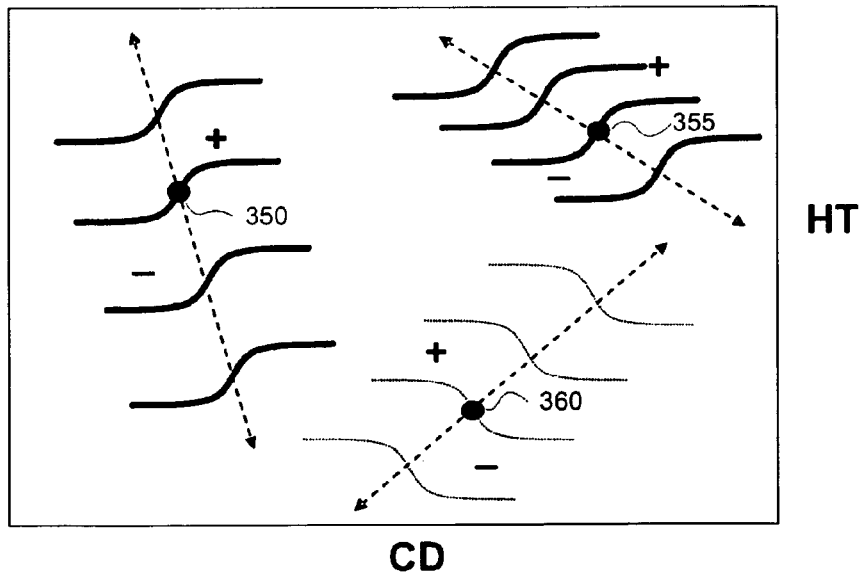
FIG. 3B illustrates a two dimensional parameter space with sigmoids distributed with a primary and auxiliary sampling matrix, in accordance with an embodiment.

At operation 420, a centering bias vector, d, is computed. In one advantageous embodiment, the centering bias vector d centers the basis functions at the primary and auxiliary sampling points using the values of the diagonal the product of the forward weights matrix, W, and a concatenation of the two sampling matrices, P and R, as provided for in operations 401 and 410, respectively. In one such implementation, the centering bias vector d centers the basis functions at the primary and auxiliary sampling points according to the formula:

$$d = -\text{diag}\left(W\begin{bmatrix}P^T \\ R^T\end{bmatrix}\right) \quad (3)$$

as shown in FIG. 4, where the "diag" operator extracts the diagonal of its matrix argument and reshapes it into a vector. It should be appreciated that operation 420 places constraints on the sizing of R at operation 410 so that the matrix product is conformal. By employing the diagonal operator in this manner, the auxiliary matrix R, equation (3) distributes the sigmoids across the input parameter space such that the sigmoids are centered at each of the training coordinates $\{p^i\}$ and also the auxillary coordinates $\{r_i\}$. This is shown graphically in FIG. 3B, where the sigmoids 350 and 355, corresponding to the primary matrix P, and the sigmoid 360, corresponding to the auxiliary matrix R, are positioned over a two dimensional input parameter space of feature height (HT) by critical dimension (CD). In this manner the additional hidden nodes 305 are made possible by providing for centering of neural network basis functions at points in parameter space not used for evaluating the function derivative. The elegance of employing equation (3) to determine d may then be realized.

With the forward weights W and the bias vector d determined, the nodal input matrix U is determined at operation 425. The nodal input matrix $U=[u^1 \ldots u^{L+M}]$, where $u^i=Wp^i+d$ for $1 \leq i \leq M$. Here again, the effect of introducing the auxiliary matrix, R is manifested in the nodal input matrix being of L+M dimension rather than merely M.

At operation 430, the nodal output matrix is determined as:

$$S(U)=[\sigma(u^1) \ldots \sigma(u^{L+M})]^T \quad (4)$$

where $\sigma(u)$ is the basis function chosen for the neural network. The nodal derivative matrix is then determined at 435. The derivative output of the neural network may be written as $$\frac{dy}{dp} = v^T \Delta(Wp + d),$$

which for embodiments where a sigmoid function is employed, the nodal derivative matrix $\Delta$ is defined as:

$$\Delta(U) = \left[ W^T \frac{d\sigma}{du}(u^1) \quad W^T \frac{d\sigma}{du}(u^2) \quad \cdots \quad W^T \frac{d\sigma}{du}(u^{L+M}) \right]^T. \quad (5)$$

Next, a determination is made whether the matrix $$\begin{bmatrix} S^T \\ \Delta^T \end{bmatrix}$$

is column rank deficient at operation 440. If rank deficient, then algebraic method 400 proceeds to assign new values to the forward weight matrix and the operations 420 through 435 are repeated.

If not rank deficient, algebraic method 400 proceeds to operation 445 where the output weights are determined by solving the linear system:

$$\begin{bmatrix} S^T \\ \Delta^T \end{bmatrix} v = \begin{bmatrix} Z \\ dZ \end{bmatrix} \quad (6)$$

in the least squares sense $$\left( e.g., v = \begin{bmatrix} S^T \\ \Delta^T \end{bmatrix}^{\#} \begin{bmatrix} Z \\ dZ \end{bmatrix} \right),$$

where the symbol # represents a pseudo-inverse operator. The algebraic method 400 is then concluded at operation 450 with the neural network, such as the one hidden layer network 300 of FIG. 3A, trained with both function evaluations and derivatives.

Figure 5B:
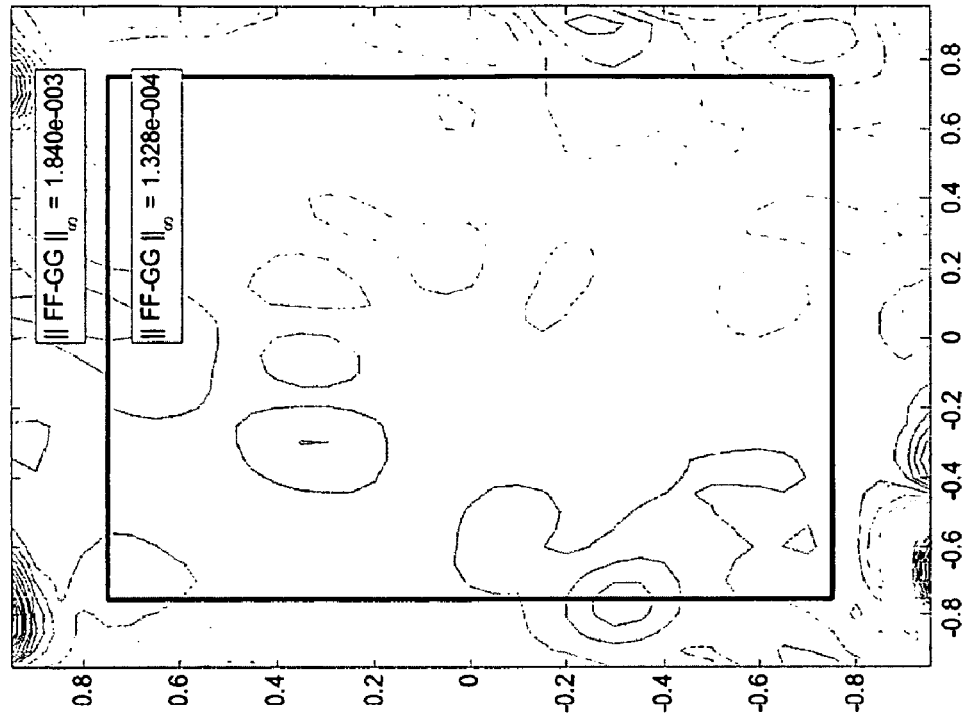
FIG. 5B depicts an error surface of a neural network trained with both function evaluations and derivative information, in accordance with an embodiment.
Figure 5A:
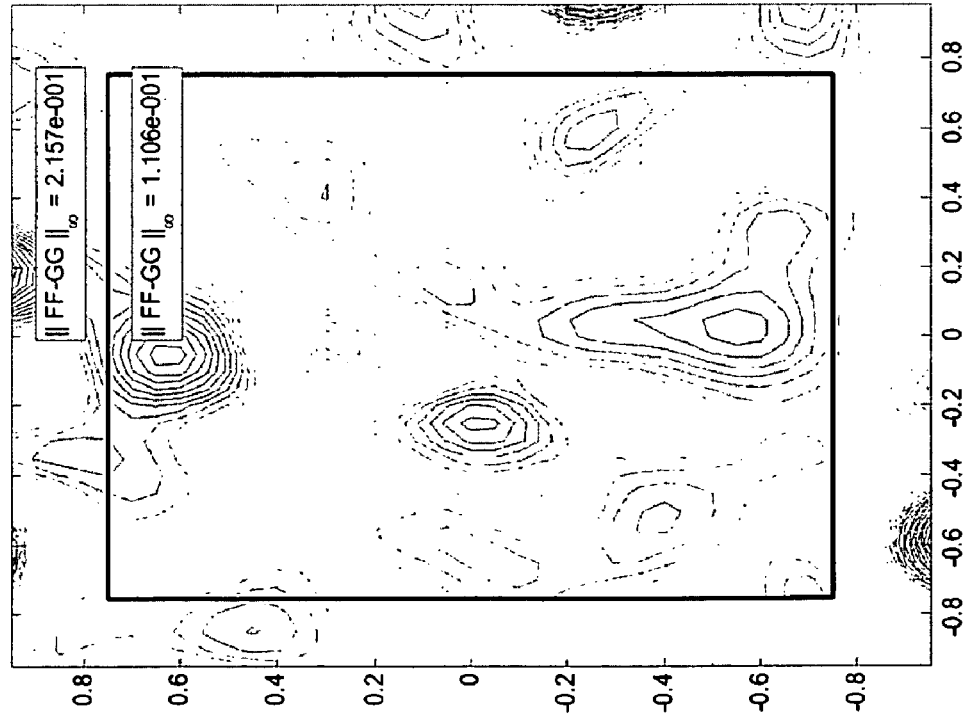
FIG. 5A depicts an error surface of a neural network trained with function evaluations only.

FIGS. 5A and 5B show a comparison of exemplary neural network models ability to approximate a spectral signal rigorously calculated (i.e. model output compared to a verification data set). FIG. 5A depicts an error surface of a neural network trained with function evaluations only. FIG. 5B depicts an error surface of a neural network trained with both function evaluations and derivative information, in accordance with an embodiment. As depicted, both the errors within the box (representing the nominal range of the parameters) and beyond the box (representing the span of the parameter space in the training set) for the neural network trained with both function evaluations and derivative information is significantly lower than that for the neural network trained with function evaluations only.

In another embodiment, a neural network is trained with derivative information via an optimization method. For optimization methods, generally, a model corresponding to a member of the training set is input to the neural network and one or more outputs are generated by the network. The one or more outputs are compared with the corresponding outputs in the training set. Until the outputs match the data with sufficient precision, the weights are adjusted by an optimization algorithm to improve the match between the two sets of data. Once all the output data and the simulation data are compared, when the weights have converged and the output matches the expected output to a desired level of accuracy for all the members of the training set, the network is trained.

The back propagation method efficiently finds the minimum of an error function over the weight space through gradient descent such that a combination of weights minimizing the error function renders a trained neural network. The network is first initialized and the gradient of the error function is computed recursively beginning with the output node error. The network weights are then adjusted to better match the training set.

Figure 6:
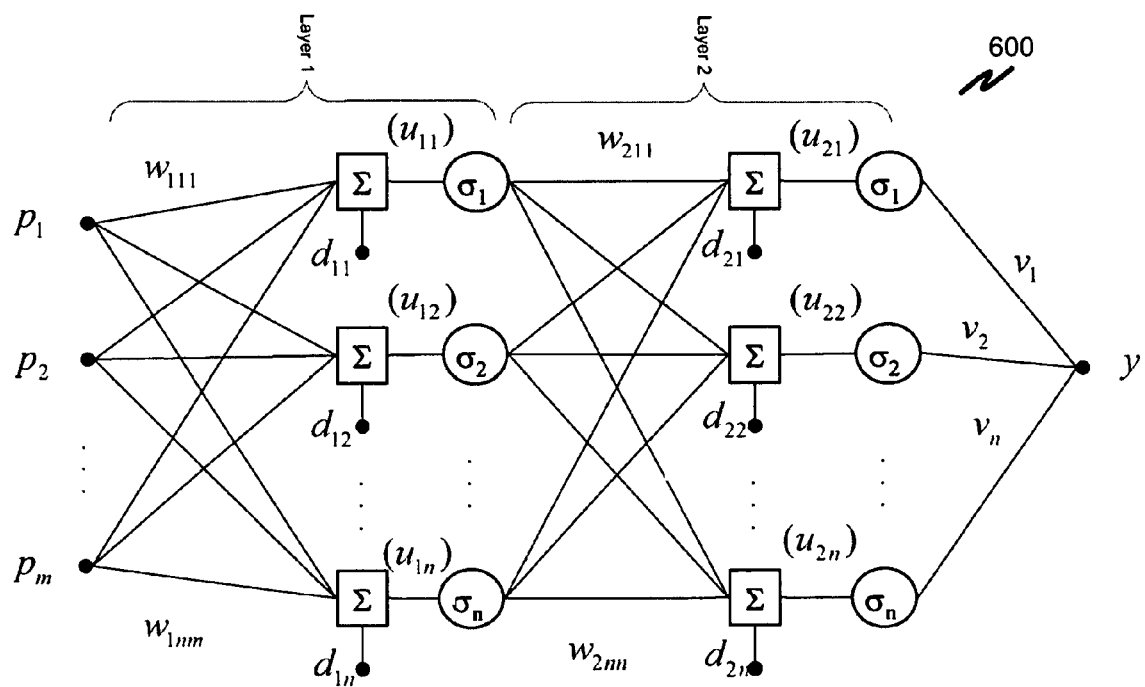
FIG. 6 depicts an exemplary two hidden layer network, in accordance with an embodiment.

FIG. 6 depicts a two hidden layer network 600 incorporating derivative information to be trained by back propagation in accordance with an exemplary embodiment. Such a multi-layered network is often better able to model complex functions than a single hidden layer network like that depicted in FIG. 3A and therefore may be employed in an implementation of the neural network meta-model 230.

Figure 7:
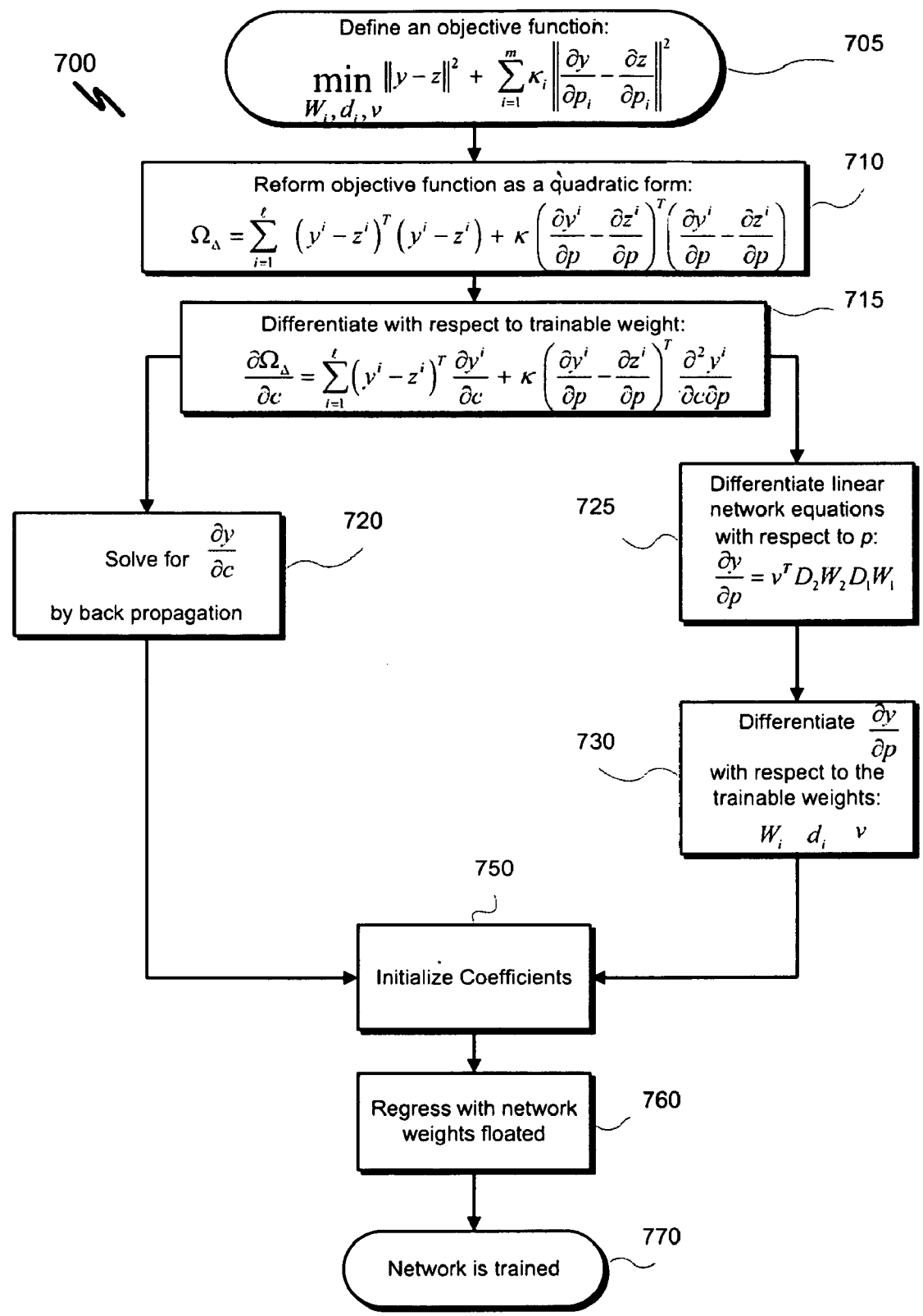
FIG. 7 is an exemplary flow diagram for training a neural network with derivative information with an optimization method, in accordance with an embodiment.

In an embodiment, optimization method 700 depicted in FIG. 7 includes training by back propagation a neural network that uses function derivatives. As depicted, derivatives of the elements in the two hidden layer network 600 are determined with respect to an objective function containing both function evaluations and derivatives. It should be appreciated that a similar methodology can be readily applied to a single hidden layer network or other multi-hidden layer networks (e.g. three hidden layer networks).

In the embodiment depicted in FIG. 7, optimization method begins at operation 705 with defining the objective function to be used in the minimization procedure as a Sobolev-type norm with the form:

$$\min_{W_i, d_i, v} \|y - z\|^2 + \sum_{i=1}^{m} \kappa_i \left\| \frac{\partial y}{\partial p_i} - \frac{\partial z}{\partial p_i} \right\|^2 \quad (7)$$

Suitable values of $\kappa_i$ are to be chosen such that the relative weightings of the function errors and derivative errors are harmonized, that is, chosen such that the influence of errors in the function evaluation is similar to errors in the derivatives. As such, one aspect of the optimization procedure minimizes the difference between a set of function evaluations $\{z^i\}$ and corresponding neural network outputs $\{y^i\}$ in the square root of the squares or two norm sense:

$$\min_{W_i, d_i, v} \|y - z\|^2 \quad (8)$$

where the norm is taken as the sum of the squares over all of the values in the function set. While the exemplary objective function is quadratic, alternate embodiments may employ any objective function known in the art, such as, but not limited to quartic functions.

To apply an optimization algorithm using the objective function (7), the derivative of the Sobolev-type norm with respect to the trainable weights is calculated. In one embodiment, the derivatives $$\frac{\partial y}{\partial W_i}, \frac{\partial y}{\partial d_i}, \text{ and } \frac{\partial y}{\partial v}$$

are efficiently computed using a back propagation method. However, in specific embodiments, because $$\frac{dy}{dp}$$

is used as an output of the two hidden layer network 600, direct differentiation of the expression $$\frac{dy}{dp}$$

performed to compute $$\frac{\partial^2 y}{\partial W_i \partial p}, \frac{\partial^2 y}{\partial d_i \partial p}, \text{ and } \frac{\partial^2 y}{\partial v \partial p}.$$

For the two hidden layer network 600, the propagation equations may be written as:

$$u_1 = W_1 p + d_1$$
$$s_1 = \sigma(u_1)$$
$$u_2 = W_2 s_1 + d_2$$
$$s_2 = \sigma(u_2)$$
$$y = v^T s_2 \quad (9)$$

From a given input, p, the states can be ascertained, allowing equations (9) to be linearized by expanding the non-linear element in a first order Taylor's series:

$$u_1 = W_1 p + d_1$$
$$s_1 \approx D_1(u_1 - u_{10}) + \sigma_1$$
$$u_2 = W_2 s_1 + d_2$$
$$s_2 \approx D_2(u_2 - u_{20}) + \sigma_2$$
$$y = v^T s_2 \quad (10)$$

The value of the diagonal matrix, $D_i$, is the value of the derivative of the nonlinear nodal function (e.g., the sigmoid function) with respect to the input, $u^i$. These values may be then collected in a linear system of the form Ax=b for each input $u^i$:

$$\begin{bmatrix} I & & & & & \\ -W_1 & I & & & & \\ & -D_1 & I & & & \\ & & -W_2 & I & & \\ & & & -D_2 & I & \\ & & & & -v^T & 1 \end{bmatrix} \begin{bmatrix} p \\ u_1 \\ s_1 \\ u_2 \\ s_2 \\ y \end{bmatrix} = \begin{bmatrix} p \\ d_1 \\ \sigma_1 - D_1 u_{10} \\ d_2 \\ \sigma_2 D_2 u_{20} \\ 0 \end{bmatrix} \quad (11)$$

Applying adjoint theory, the derivative of any objective function $\Omega$ with respect to any element c in the state matrix A and the source vector b is a sensitivity equation of the form:

$$\nabla_c \Omega = \xi^T (\nabla_c b - (\nabla_c A) x) \quad (12)$$

where the costate $\xi$ vector is computed by the adjoint equation:

$$A^T \xi = \nabla_x \Omega \quad (13)$$

Because the state vector x of the linear system has as its last component y, the usual form of the objective function (8) can be written in a quadratic form:

$$\Omega(x) = \sum_{i=1}^{n} (y^i - z^i)^T (y^i - z^i) \quad (14)$$
$$= \sum_{i=1}^{n} (e_L^T x - z^i)^T (e_L^T x - z^i)$$

The gradient of the objective function $\Omega$ with respect to the state vector x, as the right hand side of the adjoint equation, is:

$$\nabla_x \Omega = \sum_{i=1}^{n} e_L^T (e_L^T x - z^i) \quad (15)$$

Thus, the solution to the adjoint equation may be obtained by back-substitution.

Next, at operation 710, relying on the quadratic form of the two norm of equation (14), the objective function of (7) is first given the form:

$$\Omega_\Delta = \sum_{i=1}^{\ell} (y^i - z^i)^T (y^i - z^i) + \kappa \left(\frac{\partial y^i}{\partial p} - \frac{\partial z^i}{\partial p}\right)^T \left(\frac{\partial y^i}{\partial p} - \frac{\partial z^i}{\partial p}\right) \quad (16)$$

where the index of the summation goes through all of the collected training values (here with the subscript i). At operation 715, the function (16) is differentiated with respect to a trainable weight, c, is:

$$\frac{\partial \Omega_\Delta}{\partial c} = \sum_{i=1}^{\ell} (y^i - z^i)^T \frac{\partial y^i}{\partial c} + \kappa \left(\frac{\partial y^i}{\partial p} - \frac{\partial z^i}{\partial p}\right)^T \frac{\partial^2 y^i}{\partial c \partial p} \quad (17)$$

In a preferred embodiment, the first derivative, $$\frac{\partial y^i}{\partial c},$$

is computed at operation 720 via the back-propagation method previously described, while the second, $$\frac{\partial^2 y^i}{\partial c \partial p},$$

is differentiated directly. At operation 725, the two hidden layer network equations (10) are differentiated with respect to the input parameter, p, to obtain $$\frac{\partial y}{\partial p} = v^t D_2 W_2 D_1 W_1 \qquad (18)$$

Where the subscript i is dropped to simplify the notation; the values of $D_k$ and $W_k$ will in general different for each parameter input. Because the two hidden layer equations (10) linearize equations (9), equations (18) may then be differentiated at operation 730 with respect to the trainable weights, $W_k$, $d_k$, v, to have:

$$\frac{\partial^2 y}{\partial W_1 \partial p} = (I_n \otimes v^T D_2 W_2 D_1) \; vec \; (I_n) \; vec \; (I_m)^T + \ldots \qquad (19)$$

$$(p^T \otimes \mathrm{diag}(v^T D_2 W_2 C_1)^T)(I_m \otimes W_1) + \ldots$$

$$(p^T \otimes (\mathrm{diag}(v^T C_2) W_2 D_1)^T)(I_m \otimes W_2 D_1 W_1)$$

$$\frac{\partial^2 y}{\partial W_2 \partial p} = (s_1^T \otimes \mathrm{diag}(v^T D_2)^T)(I_m \otimes W_2 D_1 W_1)$$

$$\frac{\partial^2 y}{\partial d_1 \partial p} = \mathrm{diag}(v^T D_2 W_2 C_1) W_1 +$$

$$(\mathrm{diag}(v^T C_2) W_2 D_1)^T W_2 D_1 W_1$$

$$\frac{\partial^2 y}{\partial d_2 \partial p} = \mathrm{diag}(v^T C_2) W_2 D_1 W_1$$

$$\frac{\partial^2 y}{\partial v \partial p} = D_2 W_2 D_1 W$$

Where standard matrix calculus is used to describe these derivatives with the symbol ⊗ denoting the Kronecker product and the vec operator indicating the reordering of the elements of the matrix column-wise into a vector. Care should be taken to associate the correct matrix element in the above formulae with its desired derivative, which will present one skilled in the art with little difficulty. Thus, the partial derivatives $$\frac{\partial^2 y}{\partial c \partial p},$$

to optimize the network, where c is any element in matrices or vectors $W_1$, $W_2$, $d_1$, $d_2$ or v are provided.

Training of a neural network may proceed to operation 750 where a suitable initial value for the trainable weights $W_k$, $d_k$, v of the two hidden layer network 600 are determined. Then, at operation 760, a regression is performed to penalize the difference between the rigorously computed signal and the modeled signal (e.g., find a best fit) while all the weights in the two hidden layer network 600 are flowed. Upon convergence, optimization method 700 completes at operation 770 with the neural network trained.

Figure 8A:
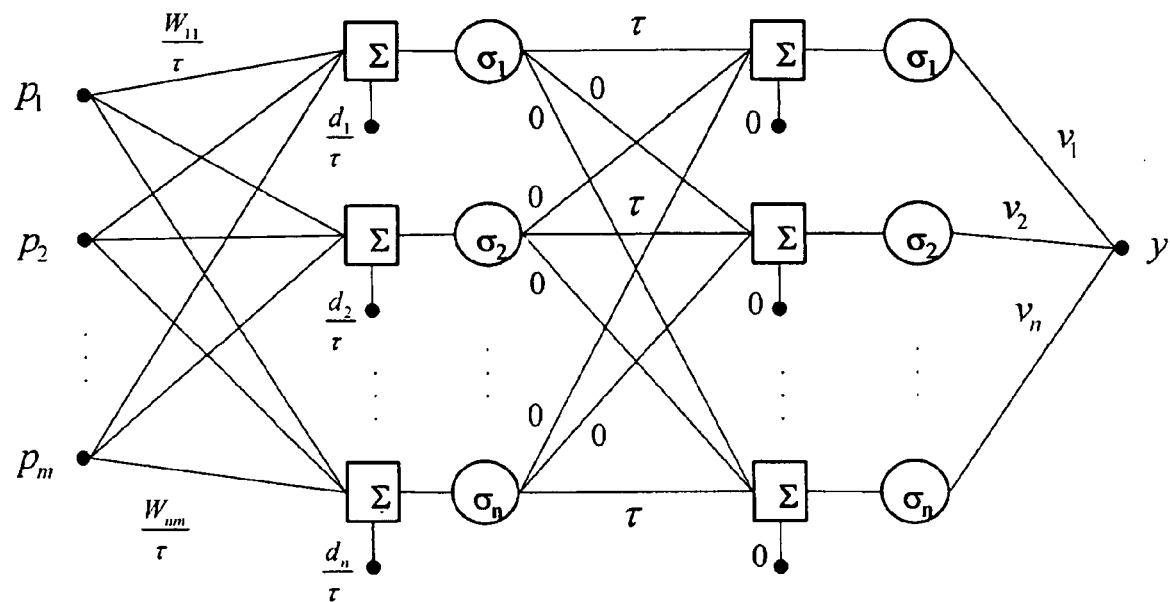
FIG. 8A depicts an exemplary two hidden layer network with initial conditions for an optimization method, in accordance with an embodiment.

A good initializer is important for training a network, particularly multi-layered networks, using an optimization method. In an advantageous embodiment, a network trained by an optimization method is initialized using an algebraic method. For certain embodiments with one hidden layer, initializing values of W, d, and v are obtained from the algebraic method 400. In further embodiments, a two hidden layer network is initialized with values that make one of the two layers appear as a pass-through making the network functionally equivalent to a one hidden layer network. For example, in a two hidden layer network embodiment, the results from the algebraic method are utilized by exploiting the property that for any input small enough, the sigmoid function is essentially linear. Thus, the inputs to the first summation are scaled by a small number, τ, and the values of the trainable weights from a one layer network (e.g., W, d, and v) are applied, as depicted in FIG. 8A and with the following relationships:

$$W_1 = \frac{1}{\tau} W \qquad (20)$$

$$d_1 = \frac{1}{\tau} d$$

$$W_2 = \tau I$$

$$d_2 = 0$$

$$v = v$$

where, the symbol I represents the identity matrix, for which the diagonal elements are one and off diagonal elements are zero. Given a value of $u_0$ and ϵ there exists a τ to ensure sufficient linearity in the second hidden layer for the expected range of values of the output of all the first summers. This approximates a two hidden layer network with a one hidden layer network.

Figure 8C:
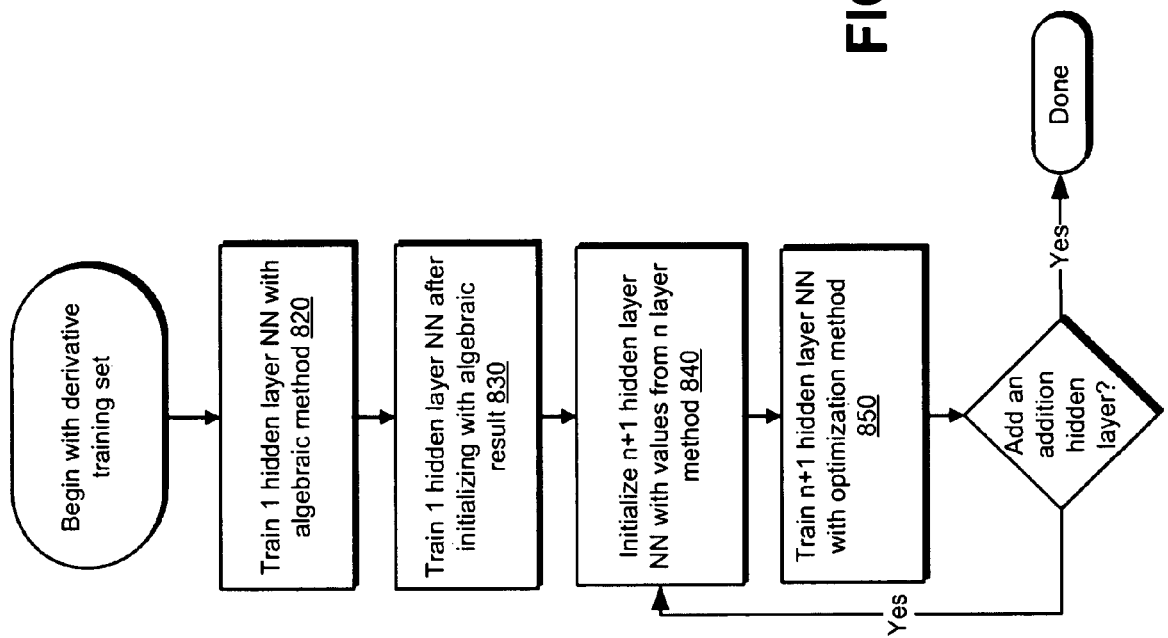
FIGS. 8B-8C are an exemplary flow diagrams for training a two hidden layer network via an optimization method initialized with the result of the algebraic training, in accordance with one embodiment.
Figure 8B:
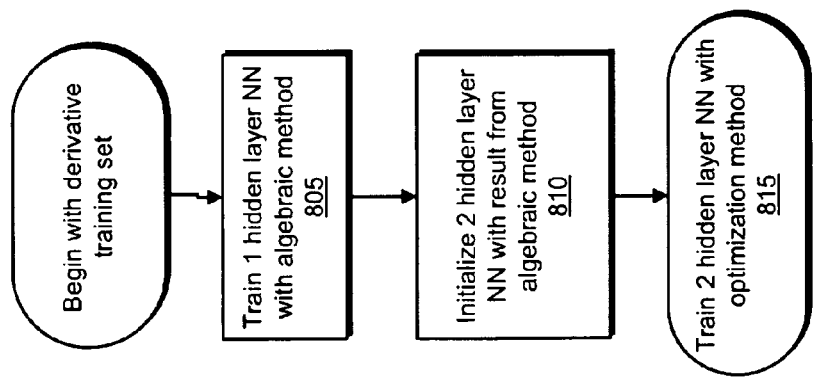

In a further embodiment depicted in FIG. 8B, the result from an algebraic training method for a one hidden layer network with derivative training data is utilized for the initial conditions of an optimization method used to train a multi-hidden layer network with derivative information. For example, beginning with a training set including derivative information, at operation 805, a one hidden layer network is trained with an algebraic method. Then, at operation 810, a two layer hidden network is initialized with the result from the algebraic method of operation 805. At operation 815, the initialized two hidden layer network is then trained by an optimization method. In one such embodiment, a result from the algebraic method 400 for a one hidden layer network, such as the one hidden layer network 300, is utilized at operation 750 of FIG. 7 for a regression algorithm to locate the neural network parameters for a two hidden layer network, such as the two hidden layer network 600, with all weights floated.

In an alternative embodiment depicted in FIG. 8C, after a one hidden layer network is trained by the algebraic method at operation 820, the algebraic method result initializes a one hidden layer neural network which then trained by the optimization method at operation 830. The resultant values are then used as the initializer in equations (20) for optimization of network having an addition hidden layer at operation 840. That network is then trained with an optimization method at operation 850. In still another embodiment, the method is applied recursively, with hidden layers being added one at a time and being initialized by the previous solution, as further shown in FIG. 8C.

Some portions of the detailed descriptions provide herein are presented in terms of algorithms and symbolic representations of operations on data bits within a computer memory. Unless specifically stated otherwise, as apparent from the following discussion, it is appreciated that throughout the description, discussions utilizing terms such as "calculating," "determining" "estimating" "storing" "collecting" "displaying," "receiving," "consolidating," "generating," "updating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description below. In addition, the present invention is not described with reference to any particular programming language. It will be appreciated that a variety of programming languages may be used to implement the teachings of the invention as described herein.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

Figure 9:
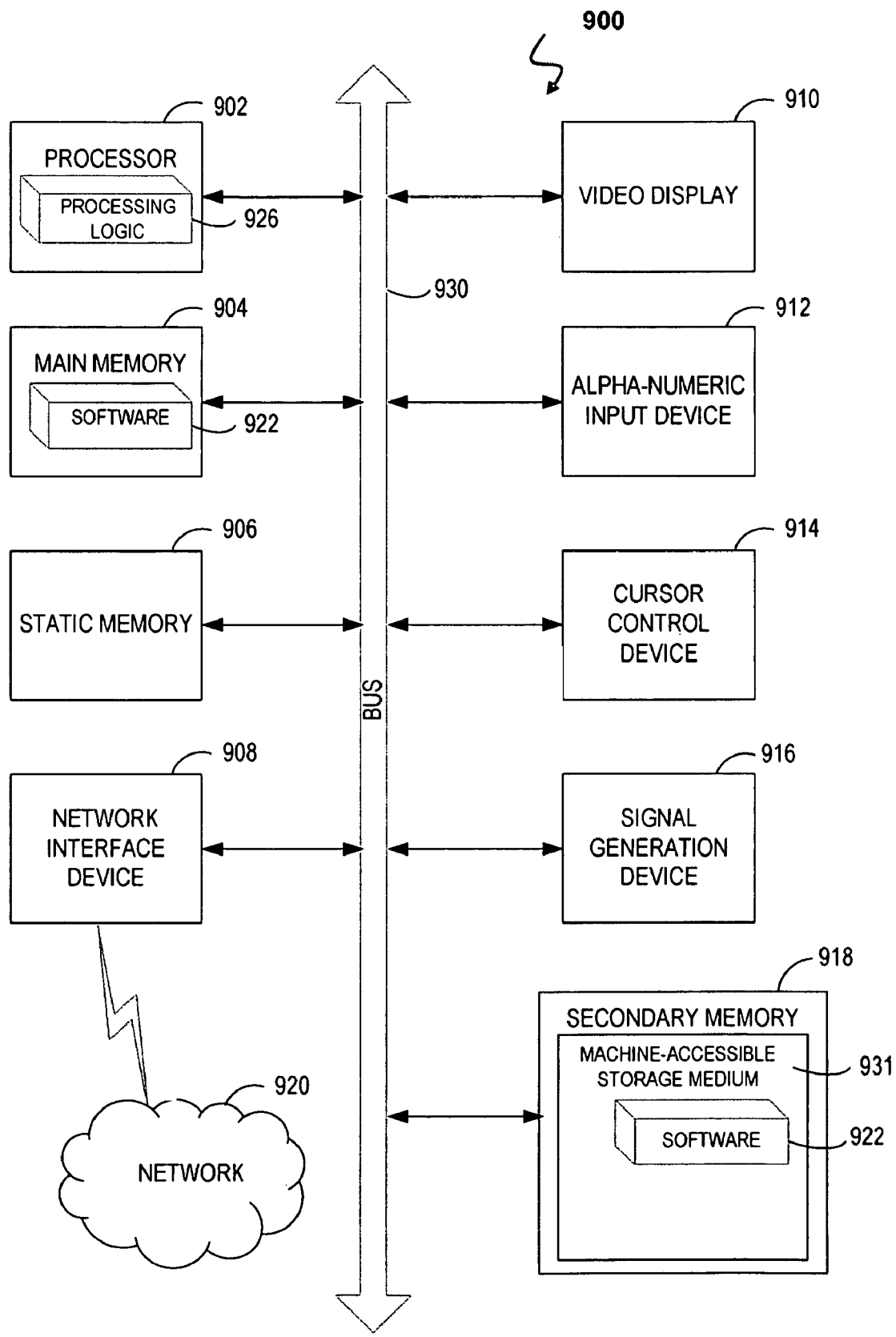
FIG. 9 illustrates a block diagram of an exemplary computer system, in accordance with one embodiment.

FIG. 9 illustrates a diagrammatic representation of a machine in the exemplary form of a computer system 900 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations and steps discussed herein.

The computer system 900 may further include a network interface device 908. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 931 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

The machine-accessible storage medium 931 may also be used to store or train a neural network, and/or a software library containing methods that train or call a neural network meta-model and/or a user interface of the neural network meta-model. The machine-accessible storage medium 931 may further be used to store one or more additional components. While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Figure 10:
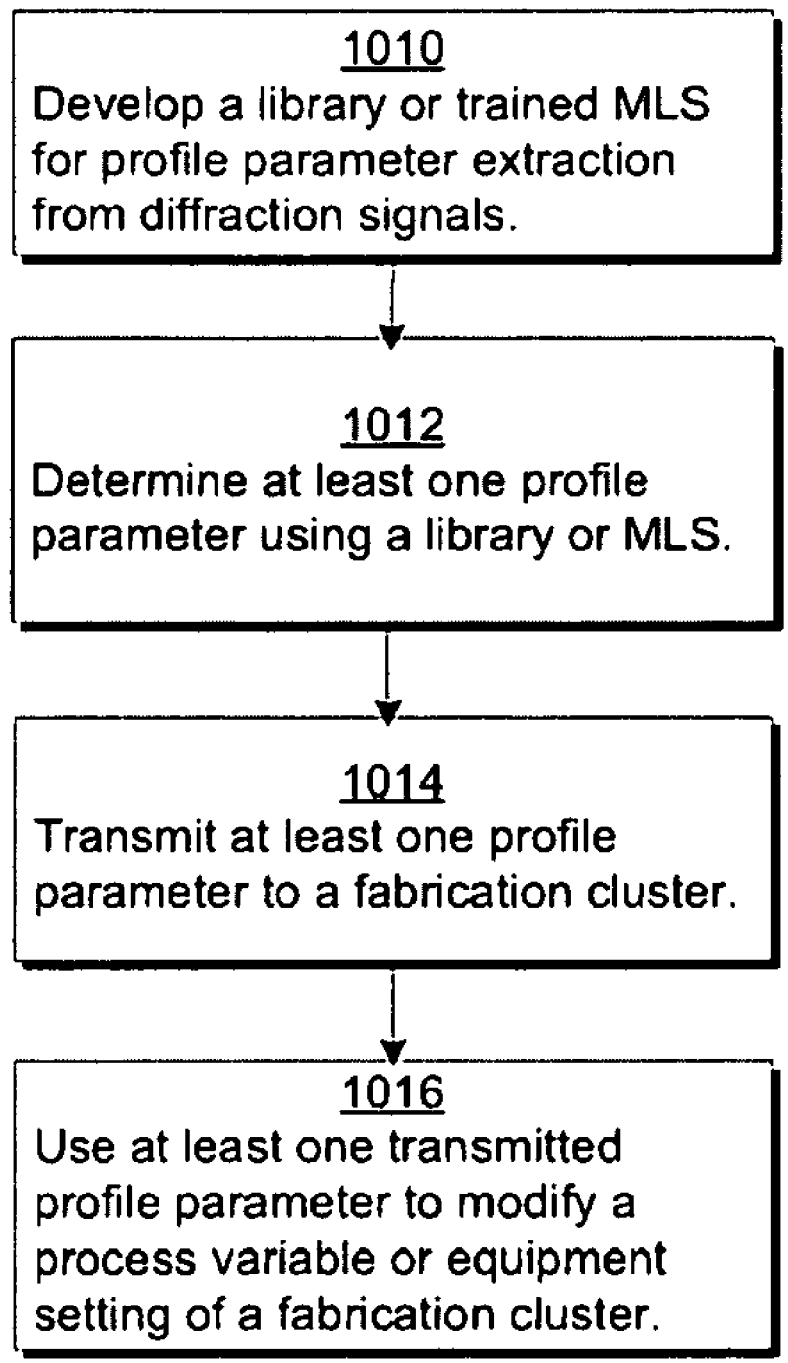
FIG. 10 is an exemplary flow diagram for determining and utilizing profile parameters for automated process and equipment control, in accordance with one embodiment.

FIG. 10 is an exemplary flowchart for determining and utilizing profile parameters for automated process and equipment control. In step 1010, a library and/or trained machine learning systems (MLS) are developed to extract profile parameters from the measured diffraction signals. In step 1012, at least one profile parameter of a structure is determined using the library or the trained MLS. In step 1014, at least one profile parameter is transmitted to a fabrication cluster configured to perform a processing step, where the processing step may be executed in the semiconductor manufacturing process flow either before or after measurement step 1012 is made. In step 1016, at least one transmitted profile parameter is used to modify a process variable or equipment setting for the processing step performed by the fabrication cluster.

Figure 11:
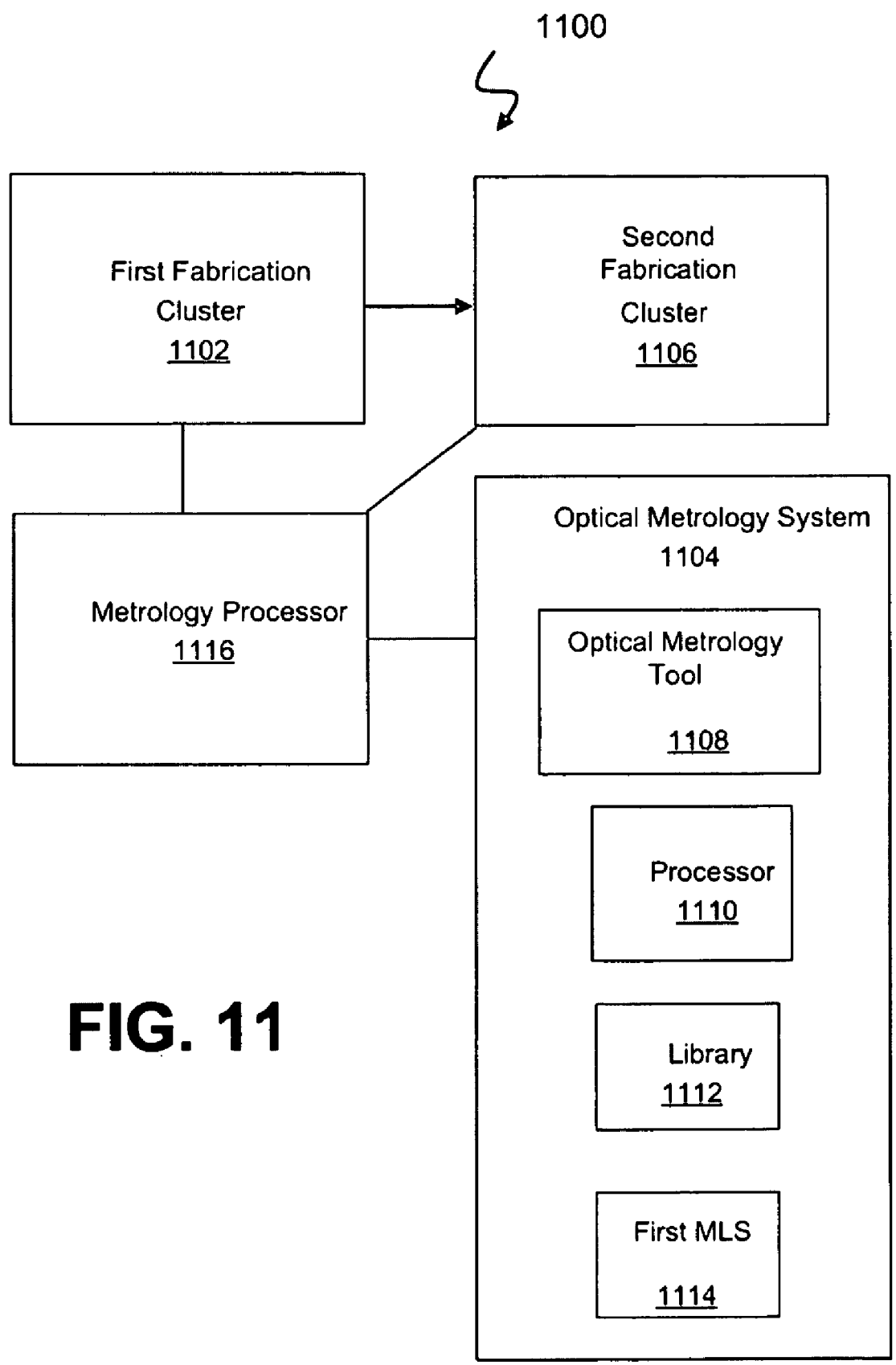
FIG. 11 is an exemplary flow diagram for determining and utilizing profile parameters for automated process and equipment control, in accordance with one embodiment.

FIG. 11 is an exemplary block diagram of a system for determining and utilizing profile parameters for automated process and equipment control. System 1100 includes a first fabrication cluster 1102 and optical metrology system 1104. System 1100 also includes a second fabrication cluster 1106. Although the second fabrication cluster 1106 is depicted in FIG. 11 as being subsequent to first fabrication cluster 1102, it should be recognized that second fabrication cluster 1106 can be located prior to first fabrication cluster 1102 in system 1100 (e.g. and in the manufacturing process flow).

A photolithographic process, such as exposing and/or developing a photoresist layer applied to a wafer, can be performed using first fabrication cluster 1102. In one exemplary embodiment, optical metrology system 1104 includes an optical metrology tool 1108 and processor 1110. Optical metrology tool 1108 is configured to measure a diffraction signal off of the structure. If the measured diffraction signal and the simulated diffraction signal match, one or more values of the profile parameters are determined to be the one or more values of the profile parameters associated with the simulated diffraction signal.

In one exemplary embodiment, optical metrology system 1104 can also include a library 1112 with a plurality of simulated (i.e. calculated) diffraction signals and a plurality of values of one or more profile parameters associated with the plurality of simulated diffraction signals. As described above, the library can be generated in advance; metrology processor 1110 can compare a measured diffraction signal of a structure to the plurality of simulated diffraction signals in the library. When a matching simulated diffraction signal is found, the one or more values of the profile parameters associated with the matching simulated diffraction signal in the library is assumed to be the one or more values of the profile parameters used in the wafer application to fabricate the structure.

System 1100 also includes a metrology processor 1116. In one exemplary embodiment, processor 1110 can transmit the one or more values of the one or more profile parameters to metrology processor 1116. Metrology processor 1116 can then adjust one or more process parameters or equipment settings of first fabrication cluster 1102 based on the one or more values of the one or more profile parameters determined using optical metrology system 1104. Metrology processor 1116 can also adjust one or more process parameters or equipment settings of the second fabrication cluster 1106 based on the one or more values of the one or more profile parameters determined using optical metrology system 1104. As noted above, fabrication cluster 1106 can process the wafer before or after fabrication cluster 1102. In another exemplary embodiment, processor 1110 is configured to train machine learning system 1114 using the set of measured diffraction signals as inputs to machine learning system 1114 and profile parameters as the expected outputs of machine learning system 1114.

It is to be understood that the above description is intended to be illustrative, and not restrictive. Many other embodiments will be apparent to those of skill in the art upon reading and understanding the above description. Although the present invention has been described with reference to particularly graceful embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method of generating a meta-model for scatterometry analysis of a sample diffracting structure having unknown parameters, the method comprising:
    generating a training set by rigorously computing a spectral signal evaluation and an evaluation of the spectral signal differentiated with respect to at least one parameter across a parameter space; and
    training a neural network with the training set to provide reference spectral information for a comparison of the reference to spectral information recorded from the sample diffracting structure.

2. The method as in claim 1, wherein the training further comprises:
    initializing the neural network coefficients; and
    regressing the neural network weights to minimize an objective function containing both function evaluations and derivatives penalizing the difference between the rigorously computed signal and the modeled signal.

3. The method as in claim 2, wherein initializing the neural network coefficients further comprises:
    determining a set of coefficients, the set including at least one coefficient corresponding to a coefficient resulting from a one hidden layer neural network trained by an algebraic method with a training set including derivative information.

4. The method as in claim 3, wherein the neural network has two hidden layers and where the coefficients of one of the two hidden layers is initialized with values that make the one layer appear as a pass-through and the network functionally equivalent to a one hidden layer network.

5. The method as in claim 2, wherein a derivative of the objective function with respect to the trainable weights is determined in part with a back propagation method and in part with a direct differentiation.

6. The method as in claim 2, wherein the objective function is quadratic and a least squares difference between the rigorously computed signal and the modeled signal is minimized.

7. The method as in claim 1, wherein the training is by an algebraic method further comprising:

evaluating the spectral signal and the spectral signal derivative for an input matrix P comprising M points selected from an N dimensional parameter space to generate an output matrix of primary sampling points;

selecting L points comprising fewer than or equal to MN points, from the N dimensional parameter space to generate a matrix R of auxiliary sampling points; and setting the bias vectors d so as to center the basis functions of the neural network at both the primary and secondary sampling points.

8. The method of claim 7, wherein setting the bias vectors d further comprises:

computing the bias vector d using values of a diagonal of the product of a forward weights matrix W and a matrix of the input matrix P and auxiliary matrix R.

9. The method as in claim 8, wherein the training further comprises:

determining a neural network nodal output matrix S across both the primary and auxiliary sampling points;

determining a neural network nodal derivative matrix $\Delta$; and determining an output weight matrix v by solving a linear system including S, $\Delta$ a rigorously computed spectral signal matrix Z, and a rigorously computed spectral signal derivative matrix dZ.

10. The method as in claim 9, further comprising:

employing v, d and W as initial conditions for training a second neural network with an optimization method.

11. A machine-accessible storage medium having instructions stored thereon which cause a data processing system to perform a method of generating a meta-model for scatterometry analysis of a sample diffracting structure having unknown parameters, the method comprising:

generating a training set by rigorously computing a spectral signal evaluation and an evaluation of the spectral signal differentiated with respect to at least one parameter across a parameter space; and training a neural network with the training set to provide reference spectral information for a comparison to sample spectral information recorded from the sample diffracting structure.

12. The storage medium as in claim 11, having instructions stored thereon which cause a data processing system to perform the method further comprising:

initializing the neural network coefficients; and regressing the neural network weights to minimize an objective function which penalizes the difference between a rigorously computed signal and the modeled signal where the objective function contains both function evaluations and derivatives.

13. The storage medium as in claim 11, having instructions stored thereon which cause a data processing system to perform the method further comprising:

determining a set of coefficients, the set including at least one coefficient corresponding to a coefficient resulting from a one hidden layer neural network trained by an algebraic method with a training set including derivative information.

14. The storage medium as in claim 13, wherein the neural network has at least two hidden layers and where the coefficients of one of the two hidden layers is initialized with values that make the layer appear as a pass-through making it functionally equivalent to a one hidden layer network.

15. The storage medium as in claim 12, wherein a derivative of the objective function with respect to the trainable weights is determined in part with a back propagation method and in part with a direct differentiation.

16. The storage medium as in claim 12, wherein the objective function is quadratic and a least squares difference between the rigorously computed signal and the modeled signal is minimized.

17. The storage medium as in claim 11, having instructions stored thereon which cause a data processing system to perform the method further comprising:

evaluating the spectral signal and the spectral signal derivative for an input matrix P comprising M points selected from an N dimensional parameter space to generate an output matrix of primary sampling points;

selecting L points comprising fewer than or equal to MN points, from the N dimensional parameter space to generate a matrix R of auxiliary sampling points; and setting the bias vectors d so as to center the basis functions of the neural network at both the primary and secondary sampling points.

18. The storage medium as in claim 17, having instructions stored thereon which cause a data processing system to perform the method further comprising:

computing the bias vector d using values of a diagonal of the product of a forward weights matrix W and a matrix of the input matrix P and auxiliary matrix R.

19. The storage medium as in claim 18, having instructions stored thereon which cause a data processing system to perform the method further comprising:

determining a neural network nodal output matrix S across both the primary and auxiliary sampling points;

determining a neural network nodal derivative matrix $\Delta$; and determining an output weight matrix v by solving a linear system including S, $\Delta$ a rigorously computed spectral signal matrix Z, and a rigorously computed spectral signal derivative matrix dZ.

20. The storage medium as in claim 19, having instructions stored thereon which cause a data processing system to perform the method further comprising:

employing v, d and W as initial conditions for training a second neural network with an optimization method.

21. An optical metrology system for analysis of a sample diffracting structure having unknown parameters, the system comprising:

a library generator employing a neural network meta-model configured to calculate spectral information for each of a plurality of parameterized diffracting structures, the calculated spectral information including a spectral signal and the spectral signal differentiated with respect to at least one parameter of the diffracting structure; and a metrology processor to compare spectral information from the sample diffracting structure to the calculated spectral information.

22. The optical metrology system as in claim 21, further comprising a reference spectra library to store the calculated spectral information.

23. The optical metrology system as in claim 21, wherein the library generator calculates N spectral signal derivatives and N spectral signal evaluations for a parameterized diffracting structure having N degrees of freedom.

24. The optical metrology system as in claim 21, wherein parameters of the diffracting structure are in at least one of the geometric domain, optical domain, or manufacturing process domain.

* * * * *